(12) United States Patent
Miyamoto et al.

(10) Patent No.: US 10,056,438 B2
(45) Date of Patent: Aug. 21, 2018

(54) DISPLAY DEVICE AND METHOD OF MANUFACTURING THE SAME

(71) Applicant: Japan Display Inc., Tokyo (JP)

(72) Inventors: Mitsuhide Miyamoto, Tokyo (JP); Tomoki Nakamura, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 15/225,231

(22) Filed: Aug. 1, 2016

(65) Prior Publication Data
US 2017/0040386 A1 Feb. 9, 2017

(30) Foreign Application Priority Data
Aug. 6, 2015 (JP) .................................. 2015-156098

(51) Int. Cl.
| | | |
|---|---|---|
| H01L 23/00 | (2006.01) | |
| H01L 27/32 | (2006.01) | |
| H01L 51/00 | (2006.01) | |
| H05K 1/14 | (2006.01) | |
| H05K 3/32 | (2006.01) | |

(52) U.S. Cl.
CPC ............ *H01L 27/323* (2013.01); *H01L 24/32* (2013.01); *H01L 24/83* (2013.01); *H01L 51/0024* (2013.01); *H01L 51/0097* (2013.01); H01L 2224/32225 (2013.01); H01L 2224/83203 (2013.01); H01L 2224/83851 (2013.01); *H01L 2227/326* (2013.01);
(Continued)

(58) Field of Classification Search
CPC ...................................................... H01L 24/29
See application file for complete search history.

(56) References Cited

U.S. PATENT DOCUMENTS

| | | | |
|---|---|---|---|
| 2013/0306231 A1 | 11/2013 | Tanaka et al. | |
| 2015/0228704 A1* | 8/2015 | Miyake | H01L 51/0097 257/40 |
| 2017/0012015 A1* | 1/2017 | Tsukao | B32B 27/08 |

FOREIGN PATENT DOCUMENTS

| | | |
|---|---|---|
| JP | 2009-199249 A | 9/2009 |
| JP | 2010-244850 A | 10/2010 |

(Continued)

OTHER PUBLICATIONS

Japanese Office Action dated Jun. 5, 2018 for corresponding Japanese Patent Application No. 2015-156098, with partial translation.

*Primary Examiner* — Peniel M Gumedzoe
*Assistant Examiner* — Christopher Johnson
(74) *Attorney, Agent, or Firm* — Typha IP LLC

(57) ABSTRACT

A stacked body including an organic film stacked on and in contact with an inorganic substrate, a wiring pattern, a first resin layer, a light-emitting element layer, and a second resin layer is prepared. The inorganic substrate is detached from the organic film. The stacked body from which the inorganic substrate is detached, an anisotropic conductive layer containing conductive particles having a diameter larger than the thickness of the organic film, and a wiring terminal of a flexible wiring board are disposed on top one another. The stacked body, the anisotropic conductive layer, and the flexible wiring board disposed are thermocompression bonded to cause the conductive particles to enter the organic film, and the wiring pattern and the wiring terminal are electrically connected by means of the conductive particles.

3 Claims, 14 Drawing Sheets

(52) U.S. Cl.
CPC ...... *H01L 2251/5338* (2013.01); *H05K 1/147* (2013.01); *H05K 3/323* (2013.01); *H05K 2201/10128* (2013.01)

(56) References Cited

FOREIGN PATENT DOCUMENTS

| | | |
|---|---|---|
| JP | 2013-152561 A | 8/2013 |
| JP | 2014-170686 A | 9/2014 |
| JP | 2014-197522 A | 10/2014 |
| JP | 2015-072361 A | 4/2015 |
| WO | 2013/021560 A1 | 2/2013 |

\* cited by examiner

DISPLAY DEVICE AND METHOD OF MANUFACTURING THE SAME

CROSS-REFERENCE TO RELATED APPLICATION

The present application claims priority from Japanese application JP2015-156098 filed on Aug. 6, 2015, the content of which is hereby incorporated by reference into this application.

BACKGROUND OF THE INVENTION

1. Field of the Invention

The present invention relates to a display device and a method of manufacturing the same.

2. Description of the Related Art

As a mobile display device, a flexible device is under development. WO 2013/021560 discloses a method of manufacturing a flexible device. In general, glass is used for a substrate of a display device. In the flexible device, a resin substrate is used instead of an inorganic substrate. The resin substrate is superior in impact resistance or weight reduction to the glass substrate.

Compared with the display device using the glass substrate, the flexible device has a complicated manufacturing step, which increases its manufacturing cost.

In the manufacture of a touch panel-mounting display panel having flexibility, it is conceivable to bond a flexible display panel and a flexible touch panel together. However, in order to produce a thin touch panel-mounting display panel at lower cost, it is effective to integrally form the display panel with the touch panel. For performing such manufacture, a step of integrating an inorganic substrate of glass or the like on which a flexible display panel is formed with another inorganic substrate on which a flexible touch panel is formed, and then removing the inorganic substrates is conceivable.

When the inorganic substrate on which the flexible touch panel is formed is manufactured, a method in which a resin layer is provided on the surface of the inorganic substrate and a wiring pattern of the touch panel is formed on the resin layer is conceivable.

In this method, however, since the wiring pattern is covered by the resin layer after the removal of the inorganic substrate, a terminal portion of the wiring pattern is not exposed. In order to perform application of signals to the touch panel and detection of signals, it is necessary to add a process for removing the resin layer on the terminal portion, and thus there is a problem in that the manufacture is complicated.

SUMMARY OF THE INVENTION

It is an object of the invention to provide, in a method of manufacturing a display panel on which a wiring pattern is mounted, a method of manufacturing a display device, by which an electrical connection between a terminal portion of the wiring pattern and a terminal outside the panel is facilitated and a reduction in yield is suppressed.

The above and other objects and novel features of the invention will become apparent from the description of the specification and the accompanying drawings.

A method of manufacturing a display device according to an aspect of the invention includes the steps of: preparing a stacked body, the stacked body including an organic film stacked on and in contact with an inorganic substrate, a wiring pattern stacked on the organic film on the side opposite to the inorganic substrate, a first resin layer stacked on the wiring pattern on the side opposite to the organic film, a light-emitting element layer provided so as to emit light whose luminance is controlled for each of a plurality of unit pixels, the light-emitting element layer being disposed on the side of the first resin layer opposite to the wiring pattern with an adhesive layer between the light-emitting element layer and the first resin layer, and a second resin layer disposed on the side of the light-emitting element layer opposite to the first resin layer; detaching the inorganic substrate from the organic film; disposing the stacked body from which the inorganic substrate is detached, an anisotropic conductive layer containing conductive particles having a diameter larger than the thickness of the organic film, and a wiring terminal of a flexible wiring board on top of one another; and thermocompression bonding the stacked body, the anisotropic conductive layer, and the flexible wiring board disposed, to cause the conductive particles to enter the organic film, and connecting the wiring pattern with the wiring terminal by means of the conductive particles.

A display device according to another aspect of the invention includes: a light-emitting element layer provided so as to emit light whose luminance is controlled for each of a plurality of unit pixels; a first resin layer disposed above the light-emitting element layer; a wiring pattern disposed above the first resin layer; an organic film disposed in a layer on the wiring pattern; a flexible wiring board attached above the organic film through an anisotropic conductive layer containing conductive particles having a diameter larger than the thickness of the organic film; and a second resin layer disposed on the side of the light-emitting element layer opposite to the first resin layer, wherein the conductive particles penetrate the organic film to electrically connect the wiring pattern with a wiring terminal of the flexible wiring board.

DETAILED DESCRIPTION OF THE INVENTION

First Embodiment

[Display Device According to First Embodiment]

First, an overview of a display device according to a first embodiment of the invention will be described with reference to FIGS. 1 to 3.

Figure 1:
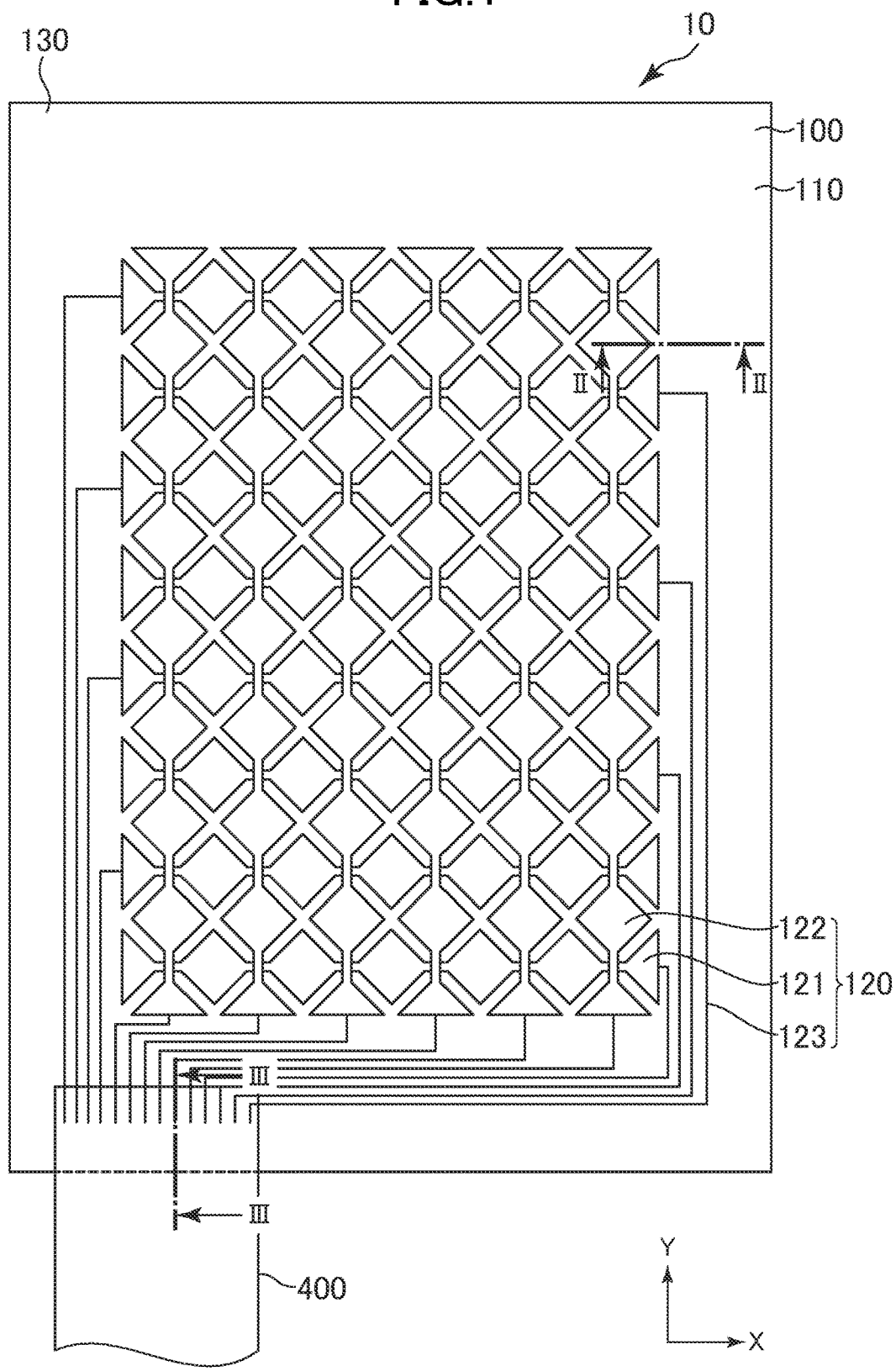
FIG. 1 is a plan view schematically showing a display device according to a first embodiment of the invention.

FIG. 1 is a plan view schematically showing the display device according to the first embodiment of the invention. FIG. 2 is a diagram showing a cross-section along the section line II-II of FIG. 1, showing the configuration of the display device according to the first embodiment. FIG. 3 is a diagram showing a cross-section along the section line III-III of FIG. 1, showing the configuration of the display device according to the first embodiment. FIG. 4 is a diagram showing in detail a portion of a cross-section of the display device according to the first embodiment of the invention.

The display device 10 according to the embodiment includes: a light-emitting element layer 210 provided so as to emit light whose luminance is controlled for each of a plurality of unit pixels constituting an image; a first resin layer 110 stacked above the light-emitting element layer 210; a wiring pattern 120 stacked above the first resin layer 110; an organic film 130 stacked in the layer on the wiring pattern 120; a flexible wiring board 400 attached above the organic film 130 through an anisotropic conductive layer 410 containing conductive particles 411 having a diameter larger than the thickness of the organic film 130; and a second resin layer 220 stacked on the light-emitting element layer 210 with the light-emitting element layer 210 therebetween on the side opposite to the first resin layer 110. The conductive particles 411 penetrate the organic film 130 to electrically connect the wiring pattern 120 with wiring terminals 412, and at least a portion of the surface of the conductive particle 411 is covered by and in direct contact with the organic film 130.

Figure 2:
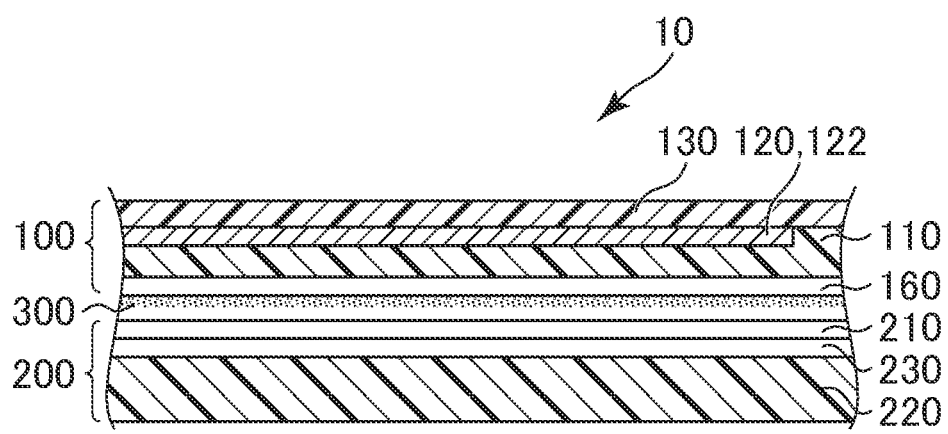
FIG. 2 is a diagram showing a cross-section along the section line II-II of FIG. 1, showing the configuration of the display device according to the first embodiment.
Figure 3:
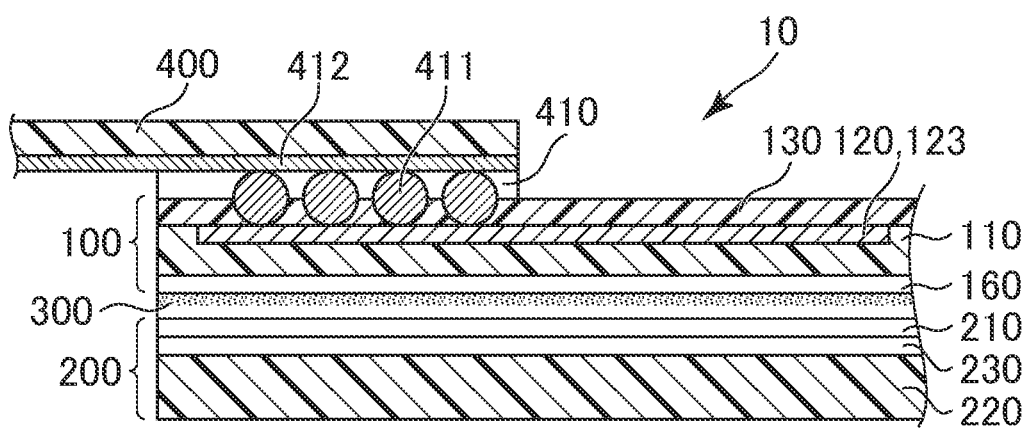
FIG. 3 is a diagram showing a cross-section along the section line III-III of FIG. 1, showing the configuration of the display device according to the first embodiment.
Figure 4:
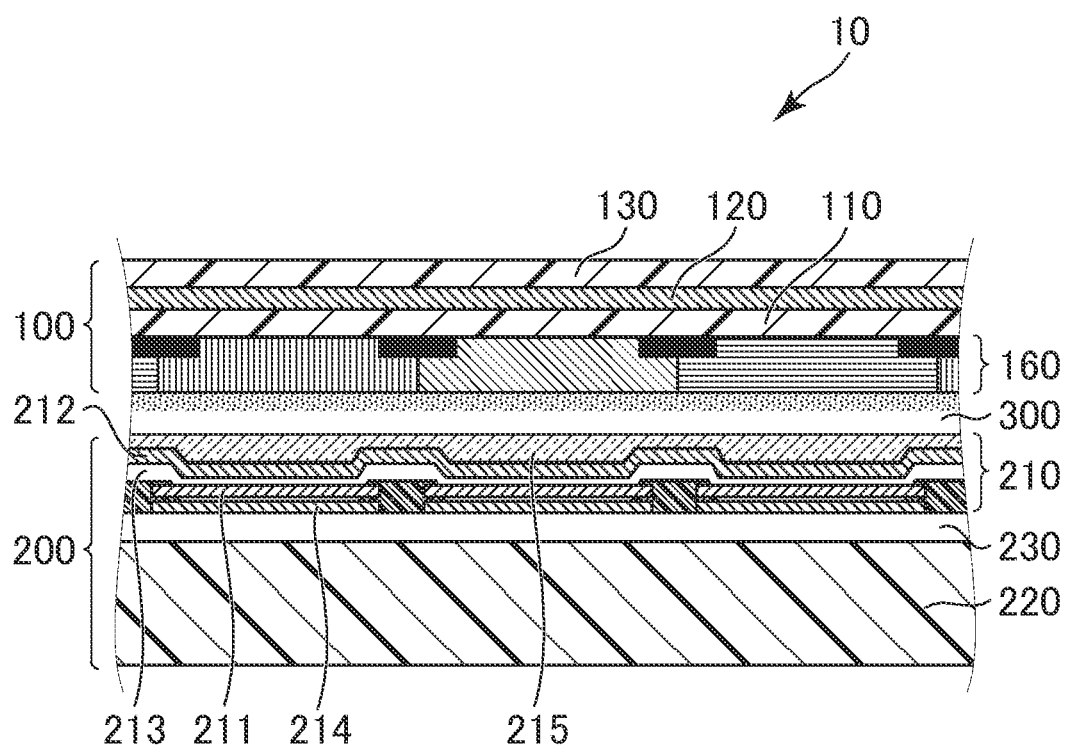
FIG. 4 is a diagram showing in detail a portion of a cross-section of the display device according to the first embodiment of the invention.

As shown in FIGS. 2 and 3, the display device 10 according to the first embodiment includes: a display panel including a first substrate 100 including the wiring pattern 120, and a second substrate 200 including the light-emitting element layer 210; and the flexible wiring board 400 electrically connected to the display panel. Moreover, as shown in FIGS. 2 and 3, the first substrate 100 and the second substrate 200 may be bonded together through an adhesive layer 300.

Hereinafter, the configuration of the display device 10 according to the embodiment will be described in detail with reference to FIGS. 1 to 4.

First, the first substrate 100 constituting a portion of the display panel will be described. As shown in FIGS. 2 and 3, the first substrate 100 in the embodiment includes: the organic film 130; the wiring pattern 120 stacked on one side of the organic film 130; and the first resin layer 110 stacked on the wiring pattern 120 on the side opposite to the organic film 130 with the wiring pattern 120 interposed between the first resin layer 110 and the organic film 130.

The organic film 130 may be formed of plastic (polycarbonate, polyethylene terephthalate, polyimide, polyacrylate, etc.).

The thickness of the organic film 130 is preferably smaller than the diameter of the conductive particle 411 described later. For example, the thickness may be 10 µm or less, 8 µm or less, 6 µm or less, or 4 µm or less.

The lower limit of the thickness of the organic film 130 is not particularly limited, but may be, for example, 1 µm or more, or 2 µm or less.

As shown in FIG. 1, the wiring pattern 120 may be a wiring pattern 120 for a touch sensor, which is configured to include first electrodes 121 extending in the X-direction, second electrodes 122 extending in the Y-direction, and connecting wirings 123 connected with the first electrodes 121 or the second electrodes 122.

Here, the connecting wirings 123 constituting a portion of the wiring pattern 120 are wirings for electrically connecting a touch sensor with a controller or a detector, provided outside the display panel, of the touch sensor. By electrically connecting the ends of the connecting wirings 123 with the wiring terminals 412 of the flexible wiring board 400 described later, control or the like for the touch sensor can be carried out.

That is, as shown in FIG. 1, the connecting wirings 123 extracted from the first electrodes 121 and the second electrodes 122 are electrically connected with the wiring terminals 412 (see FIG. 3) of the flexible wiring board 400. Moreover, the flexible wiring board 400 is connected with an external touch-sensor control unit (not shown), so that the touch sensor is controlled.

Moreover, the wiring pattern 120 for a touch sensor used in the embodiment constitutes a projected capacitive touch sensor. The projected capacitive touch sensor employs a complicated configuration in which the plurality of first electrodes 121 extending in the X-direction and the plurality of second electrodes 122 extending in the Y-direction three-dimensionally cross each other.

As shown in FIG. 1, the first electrode 121 and the second electrode 122 may have a shape in which diamond patterns are arranged side by side, and may be electrodes extending in the X-direction and the Y-direction, respectively. By employing the detection electrodes having the shape in which the diamond patterns are continuously disposed, the detection sensitivity of the touch sensor can be improved, and therefore, this employment is preferred.

The first resin layer 110 may be formed of plastic (polycarbonate, polyethylene terephthalate, polyimide, polyacrylate, etc.). The first resin layer 110 is a base substrate of the first substrate 100. Since the first resin layer 110 is formed of plastic, the first substrate 100 has flexibility.

As shown in FIGS. 2 and 3, the wiring pattern 120 is disposed so as to be covered by the organic film 130 and the first resin layer 110.

In the embodiment as shown in FIG. 4, a color filter 160 is provided on the side of the first resin layer 110 opposite to the side facing the wiring pattern 120 (the first electrode 121 or the second electrode 122). This is because the light-emitting element layer 210 provided in the second substrate 200 described later emits light of a single color (white). When, for example, a so-called separate coloring type in which light-emitting elements emit lights of a plurality of colors (red (R), green (G), and blue (B)) is employed, the color filter 160 is unnecessary.

Next, the second substrate 200 constituting a portion of the display panel will be described. As shown in FIGS. 2 and 3, the second substrate 200 is configured to include the second resin layer 220, the light-emitting element layer 210, and a circuit layer 230, and these layers are stacked on each other.

The second resin layer 220 may be formed of plastic (polycarbonate, polyethylene terephthalate, polyimide, polyacrylate, etc.). Moreover, the second resin layer 220 may be formed from the same material as the first resin layer 110 described above. The second resin layer 220 is a base substrate of the second substrate 200. Since the second resin layer 220 is formed of plastic, the second substrate 200 has flexibility.

Since the first substrate 100 and the second substrate 200 have flexibility, the display panel has flexibility, and thus the display device 10 being flexible is realized.

The circuit layer 230 may be configured of, for example, thin film transistors (TFTs). The thin film transistor may include: a semiconductor film of polysilicon or the like; a gate insulating film covering the semiconductor film; a gate electrode disposed above the semiconductor film with the gate insulating film therebetween; and a source electrode and a drain electrode that penetrate the gate insulating film to be electrically connected to the semiconductor film. Moreover, a driver circuit for driving circuits constituting the circuit layer 230 may be disposed on the second substrate 200.

The light-emitting element layer 210 may be an organic EL element layer configured to include, for example as shown in FIG. 4, an anode 211, a cathode 212, and a light-emitting layer 213 interposed between the anode 211 and the cathode 212.

Each of the anode 211 and the cathode 212 may be formed of a conductive film made of transparent metal such as indium tin oxide (ITO) or indium zinc oxide (IZO). A current is supplied to the anode 211 included in the light-emitting element layer 210 through the thin film transistor provided in the circuit layer 230 described above. The current supplied to the anode 211 flows through the light-emitting layer 213 into the cathode 212. In the light-emitting layer 213 interposed between the anode 211 and the cathode 212, electrons from the cathode 212 and holes from the anode 211 are recombined to thereby emit light. Then, the emitted light is radiated to the outside.

In the embodiment, a reflective layer 214 for efficiently radiating the emitted light to the outside is provided on the side of the anode 211 facing the second resin layer 220. The reflective layer 214 may be formed of, for example, metal or the like reflecting visible light.

Moreover, as shown in FIG. 4, the light-emitting element layer 210 may be provided with a sealing film 215 on the side facing the first substrate 100 in order to protect the light-emitting layer 213 against external moisture, oxygen, or the like.

As shown in FIGS. 2 to 4, the first substrate 100 and the second substrate 200 are bonded together through the adhesive layer 300. The adhesive layer 300 may be formed of, for example, acrylic resin.

Next, the flexible wiring board 400 constituting a portion of the display panel will be described.

As shown in FIG. 3, the flexible wiring board 400 is configured to include a flexible substrate serving as a base substrate and wirings including the wiring terminals 412.

The flexible substrate may be formed of plastic (polycarbonate, polyethylene terephthalate, polyimide, polyacrylate, etc.).

As described above, the flexible wiring board 400 is electrically connected with the ends of the connecting wirings 123 of the wiring pattern 120 provided in the first substrate 100. More specifically, the wirings provided in the flexible wiring board 400 are electrically connected through the conductive particles 411 with the ends of the connecting wirings 123 of the wiring pattern 120 provided in the first substrate 100.

Hereinafter, a connection structure of the flexible wiring board 400 (the wirings provided in the flexible wiring board 400) and the first substrate 100 (the ends of the connecting wirings 123 of the wiring pattern 120 provided in the first substrate 100) will be described in more detail.

In the display device 10 according to the embodiment, the anisotropic conductive layer 410 configured of an anisotropic conductive film (ACF) or the like is used for the connection of the flexible wiring board 400 and the first substrate 100.

The ACF includes the conductive particles 411 uniformly dispersed in a thermosetting resin. By causing the ACF to intervene between the flexible wiring board 400 and the first substrate 100 and then heating and pressurizing the flexible wiring board 400, the first substrate 100, and the ACF, the flexible wiring board 400 and the first substrate 100 can be electrically connected.

The conductive particle 411 may be configured of, for example, an insulating portion provided inside a spherical particle, and a metal layer covering the insulating portion. Moreover, the conductive particle 411 may be a sphere having a diameter of 10 μm or less, a sphere having a diameter of 7 μm or less, or a sphere having a diameter of 5 μm or less. The lower limit of the size of the conductive particle 411 is not particularly limited; however, the conductive particle 411 may be, for example, 1 μm or more in diameter or 3 μm or more in diameter.

When connecting the flexible wiring board 400 with the first substrate 100 using the ACF, the heating and pressurizing process is performed.

A region of the first substrate 100 to be connected with the flexible wiring board 400 is covered by the organic film 130. However, by heating and pressuring the flexible wiring board 400 and the first substrate 100 with the ACF interposed therebetween, the conductive particles 411 penetrate the organic film 130 to come in contact with the ends of the connecting wirings 123 of the wiring pattern 120. With this configuration, the flexible wiring board 400 and the first substrate 100 are electrically connected.

When the flexible wiring board 400 and the first substrate 100 are connected through the step described above, the conductive particles 411 penetrate the organic film 130 to electrically connect the connecting wiring 123 of the wiring pattern 120 and the wiring terminal 412 of the flexible wiring board 400 as shown in FIG. 3, and at least a portion of the surface of the conductive particle 411 is covered by and in direct contact with the organic film 130.

In order to employ the connection structure described above, the thickness of the organic film 130 is smaller than the diameter of the conductive particle 411.

The sum of the thicknesses of the organic film 130 and the first resin layer 110 may be larger than the diameter of the conductive particle 411. By adjusting the thicknesses of the organic film 130 and the first resin layer 110 so as to be larger than the diameter of the conductive particle 411, the conductive particles 411 do not penetrate the first substrate 100, so that the influence of the conductive particles 411 on the second substrate can be eliminated. As a result, the reliability of the display device 10 can be increased.

[Method of Manufacturing Display Device According to First Embodiment]

Figure 5:
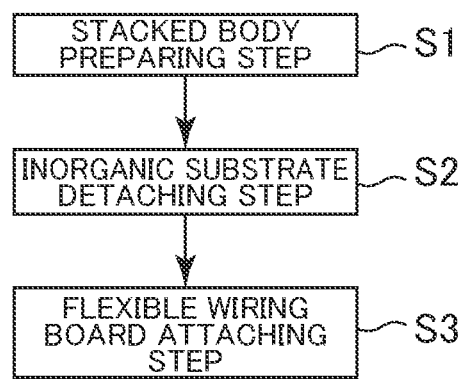
FIG. 5 is a flowchart for explaining a method of manufacturing the display device according to the first embodiment.

Next, a method of manufacturing the display device 10 according to the first embodiment will be described. FIG. 5 is a flowchart for explaining the method of manufacturing the display device according to the first embodiment.

As shown in FIG. 5, the method of manufacturing the display device 10 according to the first embodiment includes: a step of preparing a stacked body 500 (S1), the stacked body 500 including the organic film 130 stacked on and in contact with an inorganic substrate 510A, the wiring pattern 120 stacked on the organic film 130 on the side opposite to the inorganic substrate 510A, the first resin layer 110 stacked on the wiring pattern 120 on the side opposite to the organic film 130, the light-emitting element layer 210 disposed on the side of the first resin layer 110 opposite to the wiring pattern 120 and provided so as to emit light whose luminance is controlled for each of the plurality of unit pixels constituting an image, and the second resin layer 220 disposed on the side of the light-emitting element layer 210 opposite to the first resin layer 110; a step of detaching the inorganic substrate 510A from the organic film 130 (S2); and a step of attaching the flexible wiring board 400 (S3) to the stacked body 500 from which the inorganic substrate 510A and an inorganic substrate 510B are detached, through the anisotropic conductive layer 410 containing the conductive particles 411 having a diameter larger than the thickness of the organic film 130.

In the step of attaching the flexible wiring board 400 (S3), the wiring terminals 412 of the flexible wiring board 400 are thermocompression bonded to the organic film 130 through the anisotropic conductive layer 410 configured of an anisotropic conductive material, the conductive particles 411 are caused to enter the organic film 130, and thus the connecting wirings 123 and the wiring terminals 412 are electrically connected by means of the conductive particles 411.

Hereinafter, the steps in the method of manufacturing the display device 10 according to the first embodiment will be described with reference to FIGS. 6A to 6F.

Figure 6A:
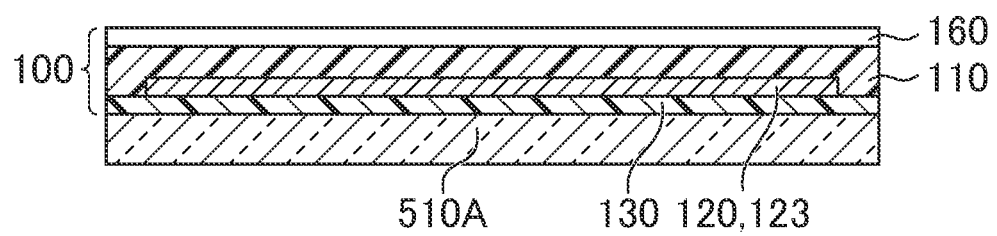
FIG. 6A is a diagram for explaining the method of manufacturing the display device according to the first embodiment, showing a first substrate constituting a portion of a stacked body and including a wiring pattern.
Figure 6B:
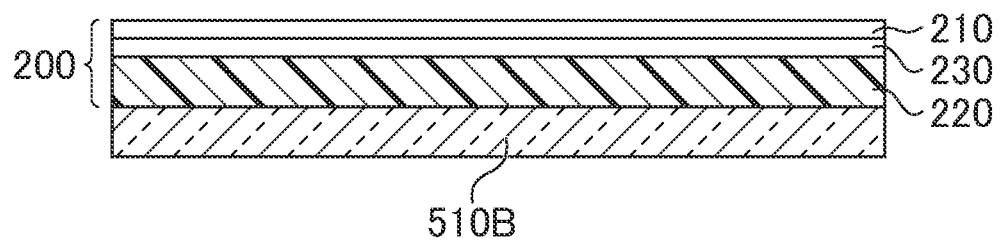
FIG. 6B is a diagram for explaining the method of manufacturing the display device according to the first embodiment, showing a second substrate constituting a portion of the stacked body and including a light-emitting element layer.
Figure 6C:
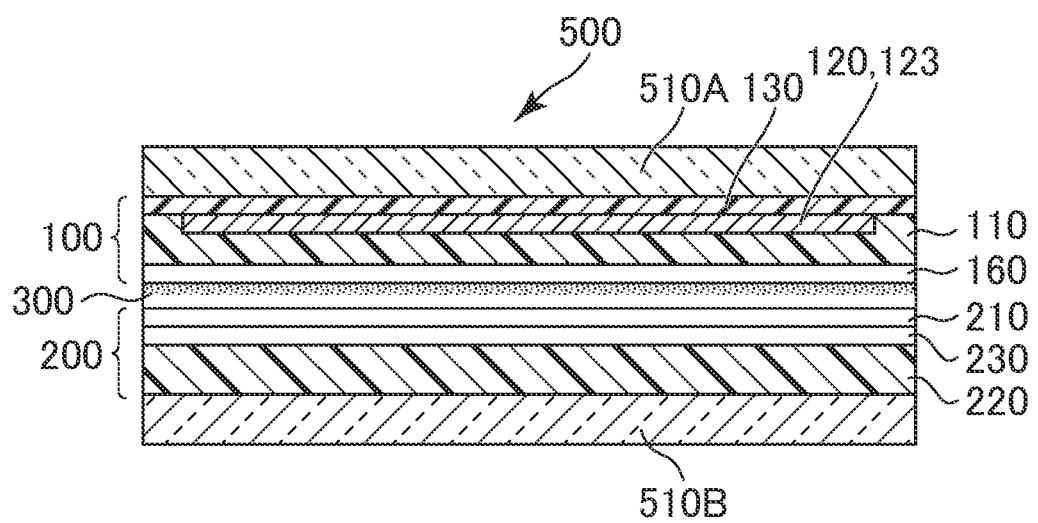
FIG. 6C is a diagram for explaining the method of manufacturing the display device according to the first embodiment, showing the stacked body prepared.

FIG. 6A is a diagram for explaining the method of manufacturing the display device according to the first embodiment, showing the first substrate constituting a portion of the stacked body and including the wiring pattern. FIG. 6B is a diagram for explaining the method of manufacturing the display device according to the first embodiment, showing the second substrate constituting a portion of the stacked body and including the light-emitting element layer. FIG. 6C is a diagram for explaining the method of manufacturing the display device according to the first embodiment, showing the stacked body prepared.

In the manufacture of the display device 10 according to the first embodiment, the stacked body 500 including the organic film 130 stacked on and in contact with the inorganic substrate 510A, the wiring pattern 120 stacked on the organic film 130 on the side opposite to the inorganic substrate 510A, the first resin layer 110 stacked on the wiring pattern 120 on the side opposite to the organic film 130, the light-emitting element layer 210 stacked on the first resin layer 110 on the side opposite to the wiring pattern 120 and provided so as to emit light whose luminance is controlled for each of the plurality of unit pixels constituting an image, and the second resin layer 220 stacked on the light-emitting element layer 210 on the side opposite to the first resin layer 110 is first prepared (S1).

The stacked body 500 may be prepared as follows: the inorganic substrate 510A, which is formed of glass or the like and on which the first substrate 100 described above is formed, shown in FIG. 6A, and the inorganic substrate 510B, which is formed of glass or the like and on which the second substrate 200 described above is formed, shown in FIG. 6B, are prepared; and the first substrate 100 formed on the inorganic substrate 510A and the second substrate 200 formed on the inorganic substrate 510B are bonded together.

The inorganic substrate 510A on which the first substrate 100 is formed, shown in FIG. 6A, may be prepared as follows. First, the organic film 130 is formed by coating, on a glass substrate as the inorganic substrate 510A, a varnish obtained by dissolving a resin as the material of the organic film 130 in a solvent, and volatilizing the solvent.

Thereafter, the wiring pattern 120 is formed on the organic film 130 by a predetermined method, and the first resin layer 110 is further stacked on the wiring pattern 120 formed. Thus, the inorganic substrate 510A on which the first substrate 100 is formed, shown in FIG. 6A, may be prepared. In the embodiment, the color filter 160 is further formed on the first resin layer 110; however, when the light-emitting element layer 210 constituting a portion of the second substrate 200 employs the so-called separate coloring type in which the light-emitting element layer emits lights of a plurality of colors (red (R), green (G), and blue (B)) as described above, the color filter 160 is unnecessary.

The inorganic substrate 510B on which the second substrate 200 is formed, shown in FIG. 6B, may be prepared as follows. First, the second resin layer 220 is formed by coating, on a glass substrate as the inorganic substrate 510B, a varnish obtained by dissolving a resin as the material of the second resin layer 220 in a solvent, and volatilizing the solvent.

Thereafter, the circuit layer 230 is formed on the second resin layer 220 by a predetermined method, and the light-emitting element layer 210 is further stacked on the circuit layer 230 formed. Thus, the inorganic substrate 510B on which the second substrate 200 is formed, shown in FIG. 6B, may be prepared.

Then, the inorganic substrate 510A on which the first substrate 100 is formed, shown in FIG. 6A, and the inorganic substrate 510B on which the second substrate 200 is formed, shown in FIG. 6B, may be bonded together through the adhesive layer 300 to thereby prepare the stacked body 500 used in the manufacture of the display device 10 according to the first embodiment.

Figure 6D:
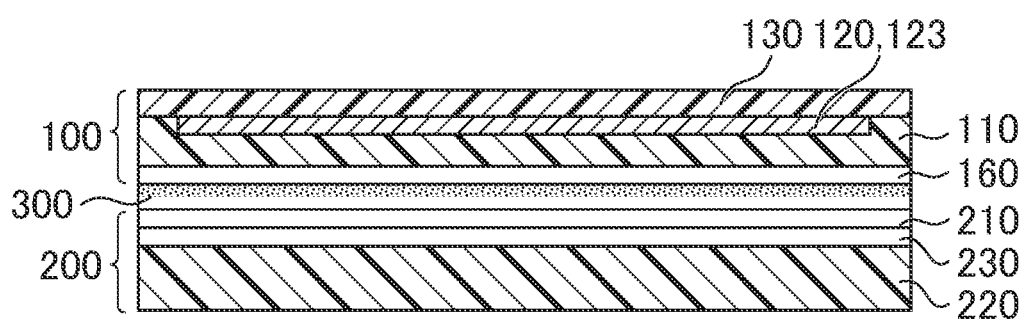
FIG. 6D is a diagram for explaining the method of manufacturing the display device according to the first embodiment, showing a state where an inorganic substrate is detached from an organic film constituting a portion of the stacked body prepared.

FIG. 6D is a diagram for explaining the method of manufacturing the display device according to the first embodiment, showing a state where the inorganic substrates 510A and 510B are detached from the organic film 130 and the second resin layer 220 constituting portions of the stacked body prepared.

After the step of preparing the stacked body 500 (S1), the step of detaching the inorganic substrates 510A and 510B (S2) constituting portions of the stacked body 500 prepared is next performed. In the stacked body 500 prepared in the embodiment, there are the inorganic substrate 510A attached to the organic film 130 of the first substrate 100 and the inorganic substrate 510B attached to the second resin layer 220 of the second substrate 200.

In the step, both the inorganic substrates 510A and 510B are removed. That is, the step (S2) includes a step of detaching the inorganic substrate 510A from the organic film 130 and a step of detaching the inorganic substrate 510B from the second resin layer 220.

In the step of detaching the inorganic substrate 510 (S2) from the organic film 130 and/or the second resin layer 220, the inorganic substrate 510 can be easily detached by, for example, subjecting the surface thereof to laser ablation. Laser ablation is an extremely effective means of detaching layers with an organic surface, such as resin, and an inorganic surface from each other as in the embodiment.

Next, the step of attaching the flexible wiring board 400 (S3) to the stacked body 500 from which the inorganic substrates 510A and 510B are detached, through the anisotropic conductive layer 410 containing the conductive particles 411 having a diameter larger than the thickness of the organic film 130, is performed.

Figure 6E:
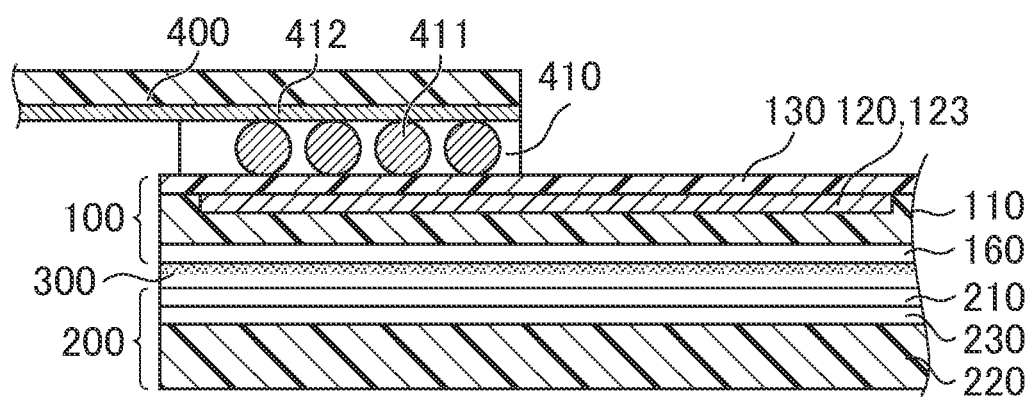
FIG. 6E is a diagram for explaining the method of manufacturing the display device according to the first embodiment, explaining a step of attaching a flexible wiring board to the stacked body from which the inorganic substrates are detached.

FIG. 6E is a diagram for explaining the method of manufacturing the display device according to the first embodiment, explaining the step of attaching the flexible wiring board to the stacked body from which the inorganic substrates are detached.

As shown in FIG. 6E, the wiring terminal 412 of the flexible wiring board 400 is placed on the end of the connecting wiring 123 of the wiring pattern 120 provided in the first substrate 100, with the ACF intervening between the wiring terminal 412 and the end of the connecting wiring 123, and thereafter, heating and pressurizing are performed. That is, the step of attaching the flexible wiring substrate 400 (S3) includes: a disposing step of disposing the stacked body from which the inorganic substrates are detached, the anisotropic conductive layer 410 containing the conductive particles 411 having a diameter larger than the thickness of the organic film 130, and the wiring terminals 412 of the flexible wiring board 400 on top of one another; and a compression bonding step of thermocompression bonding the stacked body, the anisotropic conductive layer 410, and the flexible wiring board 400 disposed, to cause the conductive particles 411 to enter the organic film 130, and electrically connecting the connecting wirings 123 with the wiring terminals 412 by means of the conductive particles 411.

With this configuration, the wiring terminals 412 of the flexible wiring board 400 and the ends of the connecting wirings 123 of the wiring pattern 120 provided in the first substrate 100 are electrically connected.

The thickness of the organic film 130 used in the embodiment is smaller than the diameter of the conductive particle 411, and the sum of the thicknesses of the organic film 130 and the first resin layer 110 is larger than the diameter of the conductive particle 411.

Figure 6F:
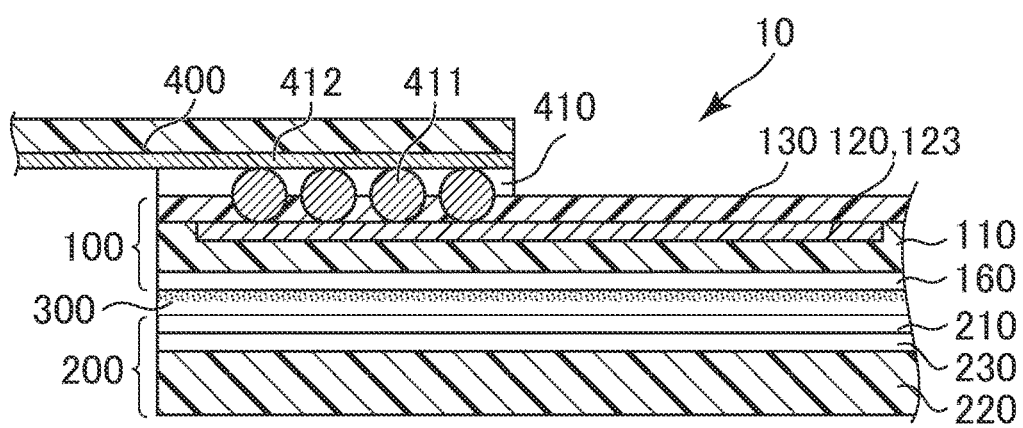
FIG. 6F is a diagram for explaining the method of manufacturing the display device according to the first embodiment, showing a state where the flexible wiring board is attached to the stacked body from which inorganic substrates are detached.

FIG. 6F is a diagram for explaining the method of manufacturing the display device according to the first embodiment, showing a state where the flexible wiring board is attached to the stacked body from which the inorganic substrates are detached. As shown in FIG. 6F, the wiring terminal 412 of the flexible wiring board 400 is thermocompression bonded to the organic film 130 through the anisotropic conductive layer 410 configured of the anisotropic conductive material (ACF), the conductive particles 411 are caused to enter the organic film 130, and thus the connecting wiring 123 and the wiring terminal 412 are electrically connected by means of the conductive particles 411.

Moreover, FIG. 6F shows a state where the conductive particles 411 penetrate the organic film 130 to electrically connect the wiring pattern with the wiring terminal 412 of the flexible wiring board and at least a portion of the surface of the conductive particle 411 is covered by and in direct contact with the organic film 130.

Through the plurality of steps (S1 to S3), the display device 10 according to the embodiment is manufactured. The method of manufacturing the display device 10 described above is a method of manufacturing the display device 10, by which the electrical connection between the connecting wiring 123 and the wiring terminal 412 is facilitated and a reduction in yield is suppressed.

Moreover, the display device 10 according to the embodiment is a display device 10 in which the electrical connection between the connecting wiring 123 and the wiring terminal 412 during manufacture is facilitated and which has high reliability.

Second Embodiment

[Display Device According to Second Embodiment]

Next, an overview of a display device according to a second embodiment of the invention will be described.

The display device 20 according to the second embodiment differs from the display device 10 according to the first embodiment in the organic film 130 and the wiring pattern 120, and the configuration of the display device 20 other than the organic film 130 and the wiring pattern 120 is similar to that of the display device 10 according to the first embodiment. Hereinafter, the organic film 130 and the wiring pattern 120 of the display device 20 according to the second embodiment will be described.

Figure 7:
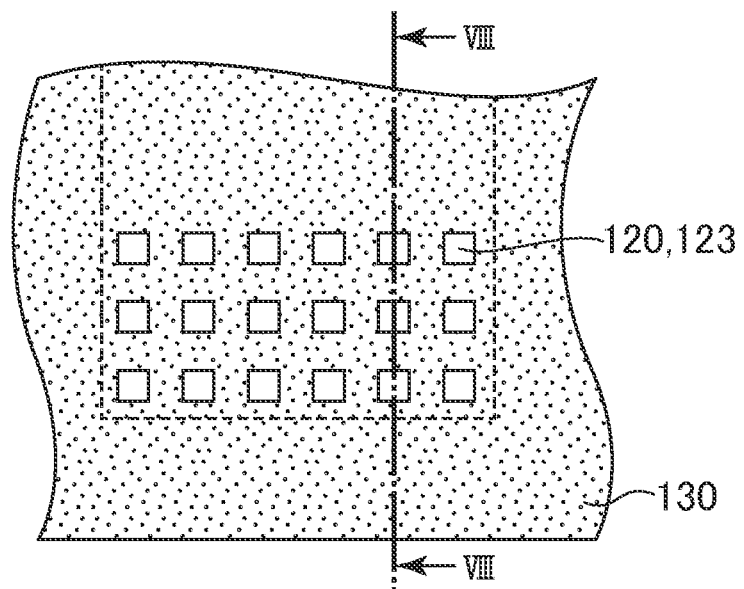
FIG. 7 is a diagram showing in an enlarged manner a portion of an organic film constituting a portion of a display device according to a second embodiment.
Figure 8:
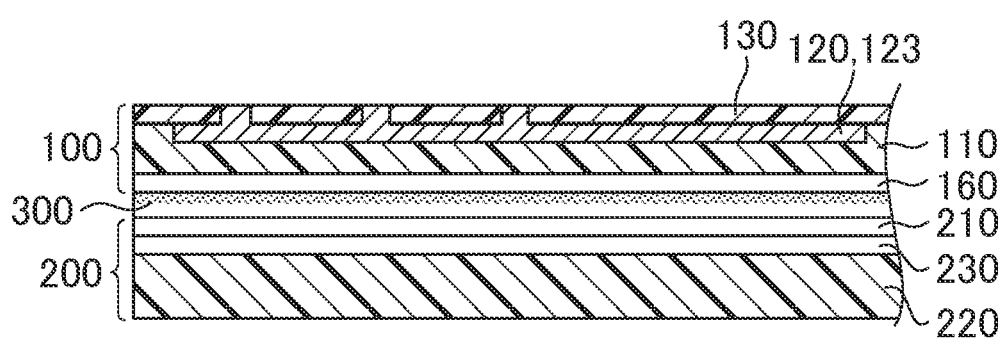
FIG. 8 is a diagram showing a cross-section of a stacked body constituting a portion of the display device according to the second embodiment.

FIG. 7 is a diagram showing in an enlarged manner a portion of the organic film 130 constituting a portion of the display device according to the second embodiment. FIG. 8 is a diagram showing a cross-section of the stacked body constituting a portion of the display device according to the second embodiment, after detachment of the inorganic substrates.

As shown in FIG. 7, the organic film 130 constituting a portion of the display device 20 according to the second embodiment includes a region where a plurality of openings smaller than the diameter of the conductive particle 411 are disposed. Moreover, the organic film 130 constituting a portion of the display device 20 according to the second embodiment may include a grid-shaped region where a plurality of openings smaller than the diameter of the conductive particle 411 are arranged in a matrix.

The wiring pattern 120 constituting a portion of the display device 20 according to the second embodiment is formed so as to enter the plurality of openings of the organic film 130. The wiring pattern 120 constituting a portion of the display device 20 according to the second embodiment is similar to the wiring pattern 120 constituting a portion of the display device 10 according to the first embodiment, except that the wiring pattern 120 is formed so as to enter the plurality of openings of the organic film 130.

Figure 9:
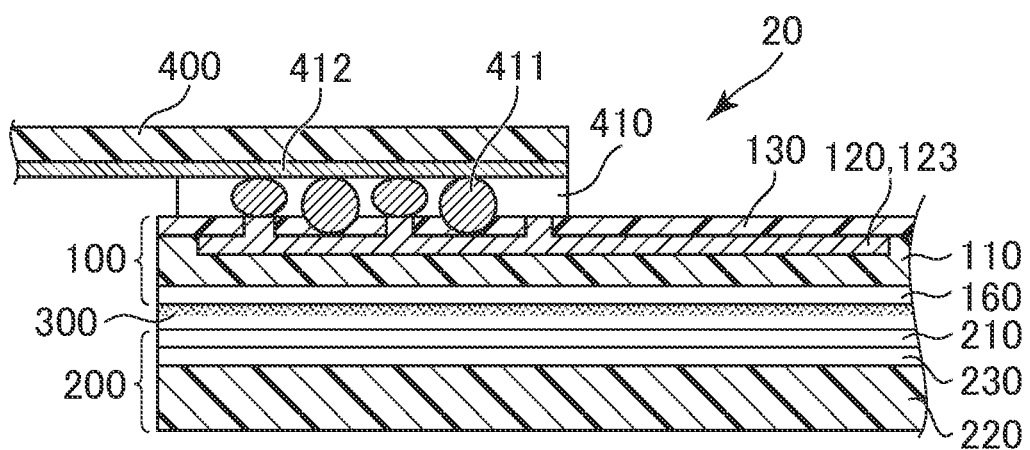
FIG. 9 is a diagram showing a cross-section of the display device according to the second embodiment, showing a state where the flexible wiring board is attached to the stacked body from which inorganic substrates are detached.

FIG. 9 is a diagram showing a cross-section of the display device according to the second embodiment, showing a state where the flexible wiring board is attached to the stacked body from which the inorganic substrates are detached. As shown in FIG. 9, the anisotropic conductive layer 410 configured of the anisotropic conductive material (ACF) is disposed inside the openings of the organic film 130 and on the organic film 130.

As has been described earlier, in the step of detaching the inorganic substrate 510 (S2) from the organic film 130 and/or the second resin layer 220, the inorganic substrates 510A and 510B can be easily detached by subjecting the surfaces thereof to laser ablation.

Laser ablation is an extremely effective means of detaching layers with an organic surface, such as resin, and an inorganic surface from each other. On the other hand, it is difficult to easily detach layers with inorganic surfaces, such as a metal that forms wirings, or glass, from each other by laser ablation.

However, the organic film 130 formed so as to include the grid-shaped region where the plurality of openings smaller than the diameter of the conductive particle 411 are arranged in a matrix can be easily detached by laser ablation irrespective of the presence of an interface between the inorganic surfaces due to the metal of the wiring exposed through the opening.

As described above, since a portion of the connecting wiring 123 of the wiring pattern 120 is exposed through the openings of the organic film 130, the conductive particles 411 are disposed so as to enter the openings, and thus the stability of connection between the first substrate 100 and the flexible wiring board 400 is further increased.

The plurality of openings provided in the organic film 130 may have, for example, a rectangular shape whose one side is less than 10 μm, a rectangular shape whose one side is less than 7 μm, or a rectangular shape whose one side is less than 5 μm.

Moreover, the plurality of openings provided in the organic film 130 may be alternately arranged, in which case the organic film 130 includes a staggered shaped region with the plurality of openings alternately arranged.

[Method of Manufacturing Display Device According to Second Embodiment]

In the method of manufacturing the display device 20 according to the second embodiment, the stacked body prepared in the step of preparing the stacked body (S1) differs from the stacked body prepared in the method of manufacturing the display device 10 according to the first embodiment. More specifically, the organic film 130 constituting a portion of the stacked body is different.

Moreover, the step of attaching the flexible wiring board 400 (S3) in the method of manufacturing the display device 20 according to the second embodiment differs from the step of attaching the flexible wiring board 400 in the method of manufacturing the display device 10 according to the first embodiment in that the wiring terminals 412 of the flexible wiring board 400 are attached to the organic film 130 through the anisotropic conductive layer 410 disposed inside the openings of the organic film 130 and on the organic film 130.

The other steps are similar to those of the display device 10 according to the first embodiment.

The method of manufacturing the display device 20 described above is a method of manufacturing the display device 20, by which the electrical connection between the connecting wiring 123 and the wiring terminal 412 is facilitated and a reduction in yield is suppressed.

Moreover, the display device 20 according to the embodiment is a display device 20 in which the electrical connection between the connecting wiring 123 and the wiring terminal 412 during manufacture is facilitated and which has high reliability.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a light-emitting element layer;
a first resin layer above the light-emitting element layer;
a wiring pattern above the first resin layer;
an organic film disposed in a layer on the wiring pattern;
a flexible wiring board above the organic film and an anisotropic conductive layer containing conductive particles having a diameter larger than the thickness of the organic film; and
a second resin layer on the side of the light-emitting element layer opposite to the first resin layer, wherein
the conductive particles penetrate the organic film to connect the wiring pattern with a wiring terminal of the flexible wiring board, and
the sum of the thicknesses of the organic film and the first resin layer is larger than the diameter of the conductive particle.

2. The display device according to claim 1, wherein
the organic film includes a region where a plurality of openings smaller than the diameter of the conductive particle are arranged, and
the wiring pattern is also in the plurality of openings of the organic film.

3. The display device according to claim 1, wherein
the organic film includes an opening,
the wiring pattern is also in the opening of the organic film, and
the anisotropic conductive layer overlaps the opening in a plan view and is provided on the organic film.

* * * * *